United States Patent
Iyer (10) Patent No.: US 9,787,273 B2
(45) Date of Patent: Oct. 10, 2017

(54) SMART VOLUME CONTROL OF DEVICE AUDIO OUTPUT BASED ON RECEIVED AUDIO INPUT

(71) Applicant: Google Technology Holdings LLC, Mountain View, CA (US)

(72) Inventor: Boby Iyer, Elmhurst, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 962 days.

(21) Appl. No.: 13/948,189

(22) Filed: Jul. 23, 2013

(65) Prior Publication Data

US 2014/0372109 A1    Dec. 18, 2014

Related U.S. Application Data

(60) Provisional application No. 61/834,618, filed on Jun. 13, 2013.

(51) Int. Cl.
*H04S 3/00* (2006.01)
*H03G 3/32* (2006.01)
*H03G 3/30* (2006.01)

(52) U.S. Cl.
CPC ............. *H03G 3/32* (2013.01); *H03G 3/3089* (2013.01)

(58) Field of Classification Search
CPC ....................................................... H04S 3/00
USPC ................................................ 704/225, 275
See application file for complete search history.

(56) References Cited

U.S. PATENT DOCUMENTS

| 5,838,274 A * | 11/1998 | Johnson .................... G06J 1/00 341/110 |
| 7,142,678 B2 | 11/2006 | Falcon |
| 7,260,209 B2 | 8/2007 | Harvey et al. |
| 8,095,694 B2 * | 1/2012 | Rostaing ................. G06F 3/165 700/94 |
| 8,170,228 B2 * | 5/2012 | Goldstein .............. A61B 5/121 381/163 |

(Continued)

FOREIGN PATENT DOCUMENTS

| EP | 2278356 | 1/2011 |
| WO | WO-2009097407 | 8/2009 |

OTHER PUBLICATIONS

"Final Office Action", U.S. Appl. No. 13/955,199, Aug. 19, 2015, 17 pages.

(Continued)

*Primary Examiner* — Michael N Opsasnick (57) ABSTRACT

A method implemented by processing and other audio components of an electronic device provides a smart audio output volume control, which correlates a volume level of an audio output to that of an audio input that triggered generation of the audio output. According to one aspect, the method includes: receiving an audio input that triggers generation of an audio output response from the user device; determining an input volume level corresponding to the received audio input; and outputting the audio output response at an output volume level correlated to the input volume level. The media output volume control level of the device is changed from a preset normal level, including from a mute setting, to the determined output level for outputting the audio output. Following, the media output volume control level is automatically reset to a pre-set volume level for normal media output.

20 Claims, 7 Drawing Sheets

(56) References Cited

U.S. PATENT DOCUMENTS

| | | | |
|---|---|---|---|
| 8,229,125 B2* | 7/2012 | Short | H03G 3/32 381/104 |
| 9,344,793 B2* | 5/2016 | Selig | H04R 1/1091 |
| 9,351,091 B2 | 5/2016 | Ivanov et al. | |
| 9,430,185 B2* | 8/2016 | Robinson | G06F 3/165 |
| 9,431,981 B2* | 8/2016 | Kauffmann | G10L 25/78 |
| 9,549,258 B2* | 1/2017 | Ramos | H04R 3/12 |
| 2006/0074684 A1 | 4/2006 | Yoshida et al. | |
| 2006/0126858 A1 | 6/2006 | Larsen et al. | |
| 2006/0161430 A1* | 7/2006 | Schweng | G10L 25/78 704/233 |
| 2006/0235688 A1* | 10/2006 | Bicego | G10L 13/04 704/254 |
| 2006/0247927 A1 | 11/2006 | Robbins et al. | |
| 2008/0069365 A1* | 3/2008 | Shuttleworth | H03G 3/32 381/57 |
| 2008/0071136 A1* | 3/2008 | Oohashi | A61M 21/02 600/27 |
| 2009/0209293 A1 | 8/2009 | Louch | |
| 2010/0195838 A1 | 8/2010 | Bright | |
| 2010/0202631 A1* | 8/2010 | Short | H03G 7/002 381/104 |
| 2010/0215184 A1 | 8/2010 | Buck et al. | |
| 2011/0044474 A1 | 2/2011 | Grover et al. | |
| 2011/0077939 A1 | 3/2011 | Jung et al. | |
| 2011/0194230 A1 | 8/2011 | Hart et al. | |
| 2011/0213901 A1* | 9/2011 | Rostaing | G06F 3/165 710/19 |
| 2012/0182539 A1 | 7/2012 | Grokop et al. | |
| 2012/0263019 A1 | 10/2012 | Armstong-Muntner | |
| 2013/0297926 A1 | 11/2013 | Eaton et al. | |
| 2013/0332156 A1 | 12/2013 | Tackin et al. | |
| 2014/0270217 A1 | 9/2014 | Ivanov et al. | |
| 2015/0078575 A1* | 3/2015 | Selig | H04R 1/1091 381/74 |

OTHER PUBLICATIONS

"International Search Report and Written Opinion", Application No. PCT/US2014/016364, Jul. 17, 2015, 19 pages.

"Invitation to Pay Additional Fees and, Where Applicable, Protest Fee", Application No. PCT/US2014/016364, May 8, 2014, 8 pages.

"Non-Final Office Action", U.S. Appl. No. 13/955,199, Apr. 9, 2015, 23 pages.

Seltzer,"Speech Recognizer-Based Microphone Array Processing for Robust Hands-Free Speech Recognition", IEEE International Conference on Acoustics, Speech, and Signal Processing Proceedings (ICASSP), Orlando, FL, New York, NY, May 13, 2002, 4 pages.

European Patent Office, International Search Report and the Written Opinion in International Patent Application PCT/US2014/042325 (Nov. 25, 2014).

"Notice of Allowance", U.S. Appl. No. 13/955,199, Jan. 29, 2016, 5 pages.

* cited by examiner

FIG. 7

SMART VOLUME CONTROL OF DEVICE AUDIO OUTPUT BASED ON RECEIVED AUDIO INPUT

BACKGROUND

1. Technical Field

The present disclosure generally relates to electronic user devices and in particular to controlling the amplitude of the audio output generated by an electronic user device. Still more particularly, aspects of the disclosure relate to controlling the amplitude of audio output that is generated by an electronic user device in response to a received voice input.

2. Description of the Related Art

Many electronic user devices or systems, such as smart phones, tablets, and personal digital assistants (PDAs) include audio components that enable the device to receive audio input and generate audible output, such as speech. A growing number of these user devices also support the use of voice command inputs to trigger specific responses from the device, and voice input is increasingly being utilized as a preferred method for hands-free interaction with the user device. With the availability of voice inputs, the device listens for audio commands and provides an audio response. As two examples, with Android based devices, Google Voice Search™ implements this feature to provide voice responses to audio inputs received at the device, while with iOS based devices. Siri™ implements this feature.

One issue with the generation of an audio response from the electronic device is that the device is required to have the media volume set to some acceptable level for the outputted audio response to be audible, while not being too loud. The level of the audio output generated in response to the received voice command input is typically preset to that of the device's media volume setting. For example, with some devices, if the device is muted, the voice readouts will not be audible. Conversely, if the audio output volume is set to a high level, the audio response can be very loud and disruptive, and in some instances, can lead to user embarrassment. As one recent enhancement overcoming the scenario in which the electronic device is muted, the media volume controller unmutes the device and sets the device's audio output to a fixed volume level (e.g., the regular audio volume level from before the user places the device on mute) before announcing the audio output at that regular volume level. However, in some situations, the owner or user of the electronic device may not want the audible output to be broadcasted from the electronic device at the fixed volume.

BRIEF DESCRIPTION OF THE DRAWINGS

The disclosure will best be understood by reference to the following detailed description of illustrative embodiments when read in conjunction with the accompanying drawings, wherein.

DETAILED DESCRIPTION

The illustrative embodiments of the present disclosure provide a method and device that implements a smart audio output volume control, which correlates and selects a volume level of an audio output issued by the device based on a volume level of an audio input that triggered generation of the audio output. According to one aspect, the method is implemented by executable components executing on one or more processors of the electronic device which perform smart audio volume control functions, which include: receiving an audio input that triggers generation of an audio output response from the user device; determining an input volume level corresponding to the received audio input; and outputting the audio output response at an output volume level correlated to the input volume level. The media output volume control level of the device is changed from a preset normal level, including from a mute setting, to the determined output level for outputting the audio output. Following completion of the audio output, the media output volume control level is automatically reset to a pre-set volume level for normal media output or to a mute setting if the device was previously muted.

In the following detailed description of exemplary embodiments of the disclosure, exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense.

Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention.

The description of the illustrative embodiments can be read in conjunction with the accompanying figures. Embodiments incorporating teachings of the present disclosure are shown and described with respect to the figures presented herein.

Figure 1:
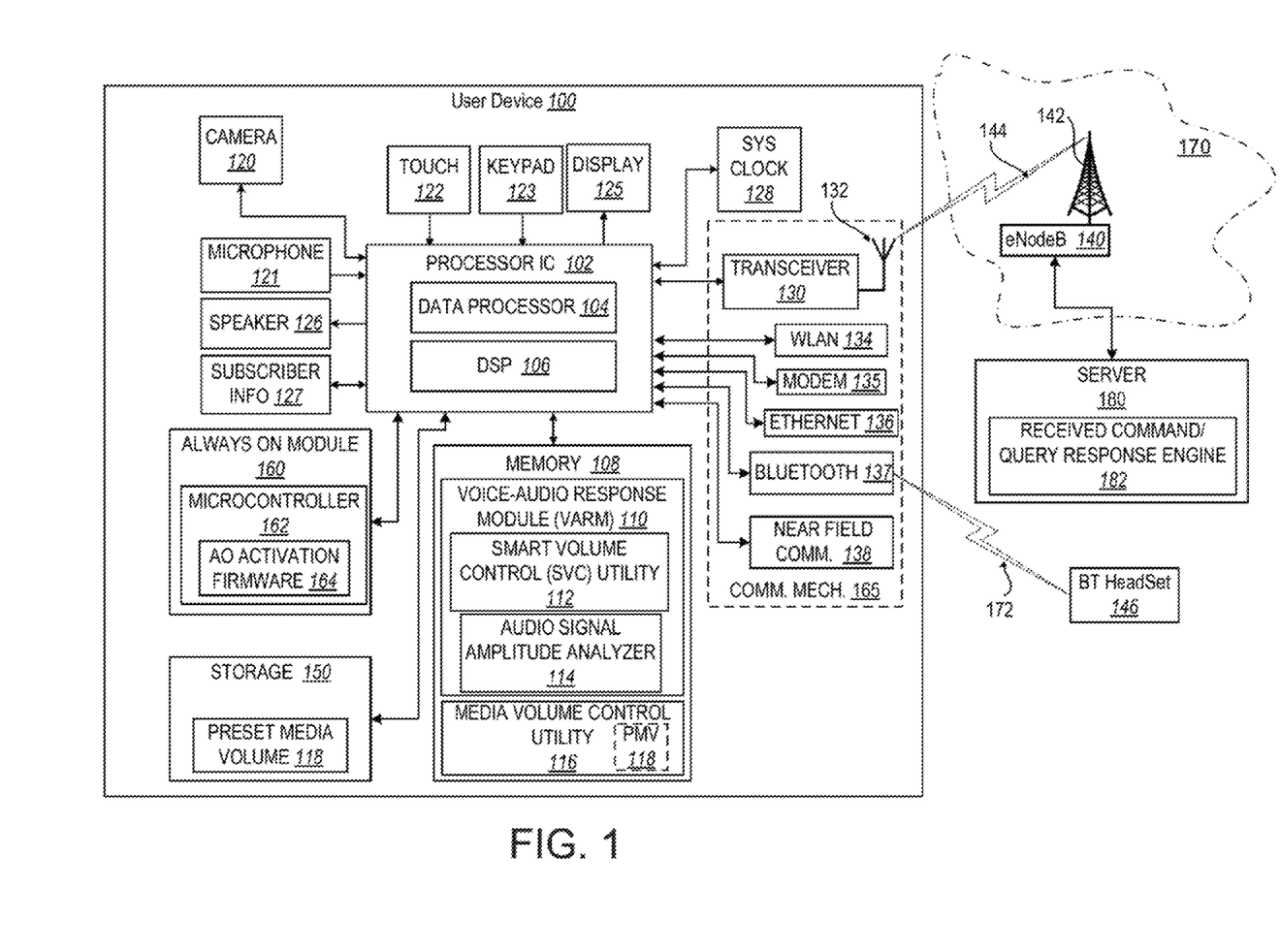
FIG. 1 provides a block diagram representation of an example user device configured with various functional components that enable one or more of the described features of the disclosure, according to one embodiment.

Turning now to FIG. 1, there is depicted a block diagram representation of an example electronic user device, interchangeably referred to herein as a user device or an electronic device, within which several of the features of the disclosure can be implemented. According to the general illustration representing an embodiment, user device 100 is a processing device that can be designed to communicate with other devices via one of a wireless communication network, generally represented by base station (evolved NodeB) 140 and antenna 142. User device 100 can be one of a host of different types of devices, including but not limited to, a mobile cellular phone or smart-phone, a laptop, a net-book, an ultra-book, and/or a tablet computing device. These various devices all provide and/or include the necessary hardware and software to enable generation of an audio output via an audio output component such as a speaker and to receive audio input via an audio input component, such as a microphone.

Referring now to the component makeup and the associated functionality of the presented components, user device 100 comprises processor integrated circuit (IC) 102, which connects via a plurality of bus interconnects (illustrated by the bi-directional arrows) to a plurality of functional components of user device 100. Processor IC 102 can include one or more programmable microprocessors, such as a data processor 104 and a digital signal processor (DSP) 106, which may both be integrated into a single processing device, in some embodiments. The processor IC 102 controls the communication and other functions and/or operations of user device 100. These functions and/or operations thus include, but are not limited to, application code processing, data manipulation, and signal processing.

Connected to processor IC 102 is memory 108, which can include volatile memory and/or non-volatile memory. One or more executable applications can be stored within memory 108 for execution by data processor 104 on processor IC 102. For example, memory 108 is illustrated containing a voice-audio response module (VARM) 110, which can include a smart volume control (SVC) utility 112 and an audio signal amplitude analyzer 114. Also included in memory 108 is media volume control utility 116. The associated functionality and/or usage of each of the software modules will be described in greater detail within the descriptions which follow. In particular, the functionality associated with and/or provided by VARM 110 is described in greater details with the description of FIG. 2 and several of the flow charts and other figures. In one or more embodiments, VARM 110 can be configured to access an externally located server 180, which provides a received voice command/query response engine 182 that supports the audio/voice-triggered search and response features utilized by VARM 110, in one or more embodiments. As illustrated, access to server 180 can be via wireless network 170, although alternate access modes can also be supported. Server 180 can be an Internet-based server that is accessible via the Internet utilizing a universal resource locator (URL) programmed into VARM 110, in one embodiment.

Also shown coupled to processor IC 102 is storage 150 which can be any type of available storage device capable of storing one or more application software and data. It is further appreciated that in one or more alternate embodiments, the device storage can actually be remote storage and not an integral part of the device itself. As provided, storage 150 contains preset media volume level 118, which is a parameter of media volume control utility 116. Preset media volume level 118 is a variable that can be manually changed by a user of user device 100, including setting the output volume to mute. Preset media volume level 118 can therefore range from a lowest volume level (e.g., 0 dB or from a muted setting) volume level to a maximum volume level (e.g., 100 dB) that is supported by the user device 100. The use of 100 dB as a maximum output volume setting is solely for example herein, and is not limiting on the actual values available for a user device. The usage and/or functionality associated with the software, firmware, and data components are described in greater detail in the following descriptions.

User device 100 also comprises one or more input/output devices, including input devices, such as camera 120, microphone 121, touch screen and/or touch pad 122, keypad 123, and/or output devices, such as display 125, speaker 126, and others. User device 100 can also include a subscriber information module (SIM) 127 which can provide (i) unique identification of the subscriber that owns or utilizes the user device 100, as well as (ii) contacts associated with the particular subscriber. In order to allow user device 100 to provide time data, user device 100 also includes system clock 128.

According to one aspect of the disclosure and as illustrated by FIG. 1, user device 100 supports at least one and potentially many forms of wireless, over-the-air or near field communication, which allows user device 100 to transmit and receive communication with at least wireless network 170 and potentially one second device, of which Bluetooth Headset 146 is provided as one example. Common examples of user device 100 can include a mobile device laptop, tablet, and personal digital assistant, to name a few. To support one or more modes of wireless communication, user device 100 can include one or more communication mechanisms 165, including transceiver 130 with connected antenna 132, wireless LAN module 134, Bluetooth® transceiver 137 and near field communication transceiver module 138, to name a few. As further illustrated, user device 100 can also include components for wired communication, such as modem 135 and Ethernet module 136. Collectively, these wireless and wired components provide a communication means or mechanism 165 by which user device 100 can communicate with other devices and networks, such as the Bluetooth headset 146 indicated, via over-the-air signals 172.

As introduced above, the wireless communication can be via a standard wireless network, which includes a network of base stations, illustrated by evolution Node B (eNodeB) 140 and associated base station antenna 142. A first over-the-air signal 144 is illustrated interconnecting base station antenna 142 with local antenna 132 of user device 100. Additionally, communication with the at least one second device (146) can be established via near field communication transceiver module 138.

Finally, according to the illustrated embodiment, user device 100 comprises an always on (AO) audio module 160, which is presented as a physical component having a microcontroller 162 and AO activation firmware 164. The AO activation firmware 164 executes on the microcontroller 162 and configures the AO module 160 to support functions including: (a) monitoring for and detecting a specific audio input trigger; (b) responding to the audio input trigger by waking up the user device 100 (if asleep); and (c) if the process of waking up of the device includes generating an audio response, triggering operation of VARM 110 to generate an audio output response to the detected audio input trigger. In one embodiment, receipt of the audio input trigger does not cause AO activation firmware 164 to generate an audio output response, and thus the above process (c) is not implemented. It is appreciated that certain of the above aspects of the AO response module 160 can be provided via a software module executing on data processor 104, in one alternate embodiment. AO response module 160 provides an open microphone setting that configures the user device 100 and specifically the microphone 121 to be always listening for voice commands in order to eliminate or reduce the need for a user to physically interact with the user device 100.

As will become clear in the description herein, during operation of user device 100, VARM 110 configures user device 100 to process and respond to the received/detected voice commands and to respond to certain audio input with associated audio output that is (or can be) discernible voice speech. SVC utility 112 within VARM 110 modifies the conventional behavior of VARM 110, which is to honor the pre-set media volume levels of the user device, and enables dynamic (real time) adjustment of the volume level of the generated audio output to correlate to the volume level of the received audio input. In one aspect, VARM 110 can be equipped with additional functionality that overrides a mute setting of the user device under the assumption that the user may have unknowingly muted the device, but requires the response to an audio input to be loud enough to be audible. In one alternate embodiment, the mute setting of the user device and/or receipt of a discernible audio input that is below a certain decibel level (e.g., 2 dB) can also cause SVC utility to trigger generation of a text or visual output on display 125 of user device 100.

Figure 2:
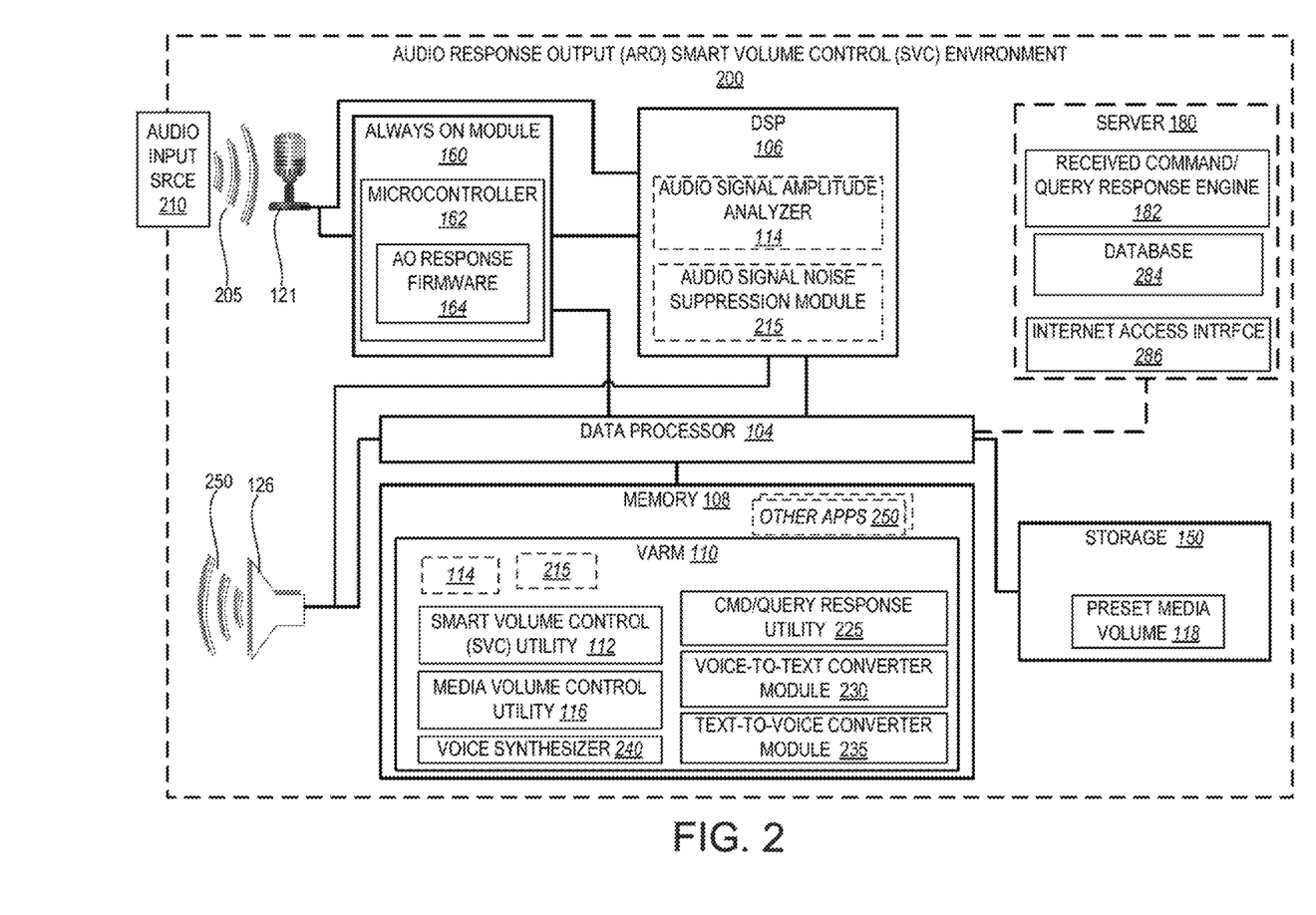
FIG. 2 illustrates the interconnected functional components of an example smart volume control environment, according to one or more embodiments.

Turning now to FIG. 2, there is illustrated a more detailed block diagram of functional components within an example Audio Response Output (ARO) Smart Volume Control (SVC) execution environment 200, which for simplicity will be hereinafter referred to as SVC environment 200. SVC environment 200 includes a combination of hardware, firmware, software and data components, which collectively implement the various aspects of the disclosure by execution of various utilities and/or functional software components within VARM 110. It is appreciated that the execution of these utilities and/or functional components occurs on one or more of data processor 104 and/or DSP 106 and/or other embedded device controllers, such as microcontroller 162. The components previously described in FIG. 1 are only briefly mentioned in the description of FIG. 2.

As shown, SVC environment 200 includes always on (AO) Module 160, which was introduced and described in the description of FIG. 1. AO Module 160 is connected to an audio capture or an audio receiving component, represented by microphone 121. Microphone 121 receives audio input 205 from an audio input source 210. In the described embodiments, audio input source 210 is a person and the audio input 205 is a voice command or a voice query. The voice command or voice query triggers or can trigger an audio output response 250, which is issued from the user device 100 via an audio output component, represented by speaker 126. AO Module 160 and microphone 121 are coupled to DSP 106, which includes audio signal amplitude analyzer 114 and audio signal noise suppression module 215, in the illustrative embodiments. It is appreciated that DSP 106 includes the standard audio codec, digital to analog converter (DAC), and other standard components of a digital signal processor. In one embodiment, audio signal amplitude analyzer 114 executes as a module within DSP 106 and configures DSP 106 to process specific types of received audio input signal 205 to determine the volume level (e.g., in decibels or relative magnitude compared to a threshold) of the received audio input. DSP 106 can also perform noise suppression via execution of noise suppression module 215, to separate out the actual voice input from background sound within the received audio input signal 205. This noise suppression enables for better analysis of the volume level of the spoken voice input.

DSP 106 and AO Module 160 are both communicatively coupled to processor 104, which performs the majority of the response generation and audio output volume modulation features described herein. SVC environment 200 is shown having a plurality of executable modules and/or program utilities, which each executes on processor 104 to configure user device 100 to perform specific functions. These modules and/or utilities are illustrated as being a part of and/or associated with VARM 100, according to one embodiment. In the illustrated embodiment, among the executable modules are SVC utility 112, media volume control utility 116, command and/or query response utility 225, voice-to-text converter module 230, text-to-voice converter module 235, and voice synthesizer 240. In addition, one or more other applications 250 can be provided within SVC environment 200. These other applications 250 can be accessed by command and/or query response utility 225 to provide answers to received voice commands and/or queries. As one example, command and/or query response utility 225 can access a calendar application, as one application present within other applications 250, to determine an answer to a received voice query of "do I have an appointment on Friday at 10 AM". Alternatively, data sources external to SVC environment 200 can be accessed to answer queries. For example, the cloud can be accessed to answer a voice query such as "what is the current weather at a particular location" It is appreciated that the list of software and firmware modules and/or utilities are maintained within a non-volatile storage and loaded into memory 108 for execution on data processor 104 when the device is powered on or, alternatively, in response to detection of a received audio input 205 that is determined to be one of a voice command or voice query that triggers the features described herein. According to one or more aspects, the voice command can be a wake-up command for AO voice activation or some other voice command, such as "call Boby cell". When the voice command is a wake-up command, the device can respond to the user with an audio confirmation of the device's entry into the AO voice mode. Alternatively, the device can simply turn on the AO voice mode, without providing any feedback or confirmation to the user. With either implementation, receipt of the correct wake-up command results in activation of the device to start listening for further audio commands or queries.

Figure 3:
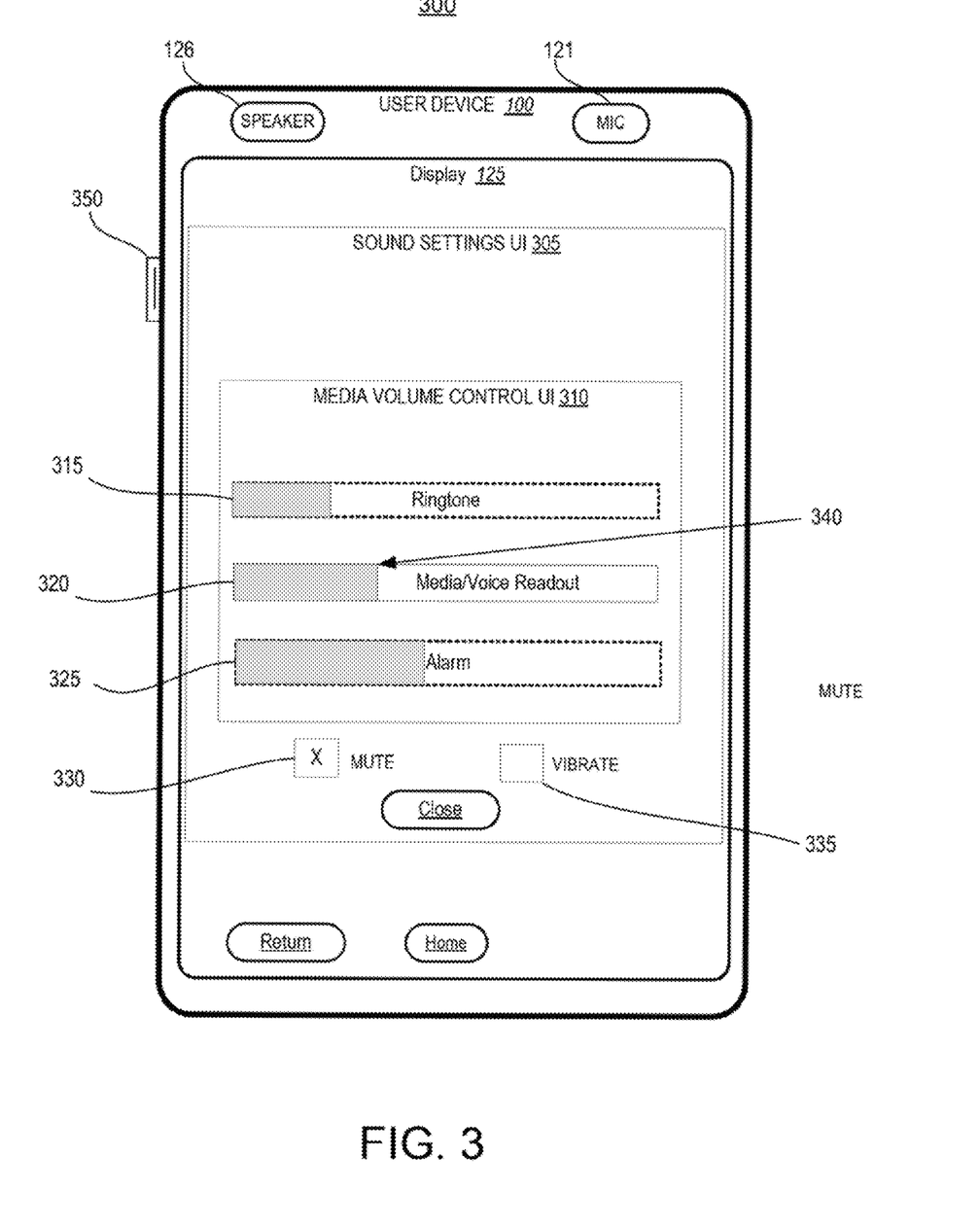
FIG. 3 illustrates an example mobile user device having a settings menu display with settings capability for media output volume, which is utilized to support the description of one or more of the described embodiments.

The functionality provided by voice-to-text converter module 230, text-to-voice converter module 235, and voice synthesizer 240 are known to those skilled in the art, and are therefore not further described herein. Media volume control utility 116 is a utility that allows a user to establish or set specific volume levels for audio output of the user device 100. An example user interface generated by execution of media volume control utility 116 is presented by FIG. 3. FIG. 3 provides a frontal view 300 of user device 100, having display 125, microphone 121, and speaker 126 identified therein. Within display 125 is presented sound settings control UI 305, which includes media volume control UI 310. In one embodiment, sound settings control UI 305 can be accessed through a top level menu or settings affordance or icon on a home screen of user device 100. Media volume control UI 310 can then be one option presented within sound settings control UI 305. As provided, within media volume control UI 310 are three selectable and/or settable volume control bars, namely ringtone 315, media/voice readout 320, and alarm 325. Volume control bar for media/voice readout 320 has an associate volume setting 340. The volume setting 340 is set by the user, and can involve use of a volume up-down button 350 or other input mechanism. Additionally, sound settings control option 305 includes selectable options mute 330 to mute the device and vibrate 335 to cause the device to vibrate instead of and/or in addition to ringing, when triggered. In the case of an AO application, a device volume selection or setting to mute, e.g., via selection of mute 330, as indicated by the check mark, can be overridden when the device needs to generate an audio output in response to an appropriate audio input trigger registered at the AO module 160. However, once the audio output generation is completed, the user device 100 reverts back to the volume setting 340 of the media/voice readout 320 regardless of what that volume setting 340 is, and/or the user device 100 reverts back to mute, if the device was previously muted. Notably, with the conventional implementation of the AO module 160, prior to the enhancements described herein, the user device would automatically default to the pre-set volume setting 340 for any response to a received voice command.

Returning now to the description of FIG. 2, coupled to processor 104 is storage 150, which includes preset media volume 118, which is held in non-volatile storage so that the device can power on to and operate with the stored preset media volume 118.

Also shown within the SVC environment 200 is remote server 180, which includes therein received command/query response engine 182, database 284 and an internet access interface 286. According to one embodiment, user device 100 can communicate with remote server 180 to obtain the required responses to a received audio input query (205) from response engine 182. The specific functionality of this operation is tangential to the core invention and is therefore not described in detail. With an Android-based user device, for example, the functionality can be provided by a Google® server that supports a Google Voice Search feature that is made available on the user device 100. The dashed lines of the remote server 180 and connecting the server to data processor 104 indicate that the connection to remote server 180 and the use of remote server 180 are optional, and the features described herein are applicable to embodiments that exclude access to remote server 180, without limitation or restriction on the breadth and scope of the disclosure.

The features of responding to received voice commands and/or queries are provided by execution of command and/or query response utility 225, and can involve use of locally stored data at storage 150 or remotely stored data, such as at remote server 180 or another server accessible through remote server 180 via the Internet. The specific aspects of that response methodology are only tangentially relevant to the disclosure and are thus not described further herein. Those skilled in the art will appreciate such details and will be able to apply those details to the understanding of those aspects of the description herein.

The above described features of user device 100 (FIG. 1) and SVC environment 200 (FIG. 2) presents several of the device and component level details of the disclosure. Collectively, these figures provide an electronic device comprising: at least one microphone that captures audio input; at least one speaker; a digital signal processor (DSP) that processes received audio input signals and generates audio output signals; a processor that is communicatively coupled to each of the at least one microphone, the at least one speaker, and the DSP; and the executable components of VARM 110 that execute on the processor/s 104 and 106 and which configures the electronic device 100 to perform a plurality of functions. Specifically, SVC utility 112 operates in conjunction with each of the other described utilities and/or modules as executable functional components within VARM 110. Thus, VARM 110 includes code, which executes on processor 104 and configures the electronic device to perform the functions of: receive an audio input that triggers generation of an audio output response from the user device; determine an input volume level corresponding to the received audio input; and output the audio output response at an output volume level correlated to the input volume level.

Additionally, in order to determine an input volume level corresponding to the received audio input, the VARM 110 further configures the device 110 to: determine one of (i) a maximum volume of a spoken command within the received audio input and (ii) an average volume of the spoken command; and apply the determined one of the maximum volume and the average volume in selecting the output volume.

Additionally, in one embodiment, in determining an input volume level corresponding to the received audio input, VARM 110 further configures the device 110 to: analyze the audio input to identify which portion of the audio input is device-decipherable spoken speech; identify background noise that is not device-decipherable spoken speech within the received audio input; and suppress the background noise.

According to one aspect of the disclosure, VARM 110 further configures the device 110 to: analyze the audio input for at least one of a voice command and a voice query that are among inputs which trigger an audio output response from the user device; and perform the determining and the outputting only in response to the audio input including one or more of the inputs. Then, in response to the voice command being a wake-up command received by an always-on module within the user device, VARM 110 configures the device 100 to: activate an AO voice mode on the device and listening for other audio input/s. Further, in response to the AO module being pre-configured to generate a response to the wake-up command, VARM 110 configures the device 100 to: retrieve a response to the wake-up command; convert the response from text to voice; and output a voice audio corresponding to the converted response through an audio output device associated with the user device at the input volume level of the received audio input. Alternatively, in response to the audio input being one of a voice command and a voice query, VARM 110 further configures the device 100 to: match the received audio input to one of a plurality of recognizable voice commands and voice queries; retrieve a response to the received audio input based on which recognizable voice command and voice queries matches the received audio input; convert the response from text to voice; translate the input volume level to an output volume level based on a relative range of volume levels supported by an audio output device compared to an audio input buffer; and generate a voice audio corresponding to the converted response through an audio output device associated with the user device at the output volume level of the audio output device that corresponds to the translated input volume level.

In one embodiment the electronic device includes a voice activated search function that triggers the user device to find one or more results of a search query included within the received audio input and provide the one or more results via an audio output.

According to one embodiment, in response to the media output volume being initially set to mute, the dynamically setting of the media output volume comprises VARM 110 configuring the device 100 to: unmute the media output volume; complete the outputting of the audio response at the matching media output volume level; and reset the media output volume to mute, wherein no audible audio output is provided that is not generated in response to a received audio input that triggers an audio output response.

Thus, as described above, rather than defaulting to setting the generated output volume to a fixed value, the disclosure provides that the volume setting for the audio output correlates to the audio input. For example, if the user whispers to the device, the device will effectively generate an audio output that is a whisper. Alternatively, if the user yells the audio input at the device, the device will generate a loud audio output (equivalent to a yell) back at the user). Thus, VARM 110 configures the device to correlate the audio output volume level with the audio input volume level reported from the microphone, rather than setting the volume to a fixed value or using the user or device pre-set volume for media audio output and/or voice readouts. The described methodology allows the user device 100 to set the volume level appropriate to the surroundings and thus avoid disruptive device usage in meetings, public events, etc. The described methodology also avoids the issue of the device being muted for audio output by automatically unmuting the device prior to issuing the audio output, without affecting the mute setting of the device for other outputs. In both scenarios, the device 100 is able to quantify the level of the audio response by tailoring the output to the same response level as the input.

Figure 4A:
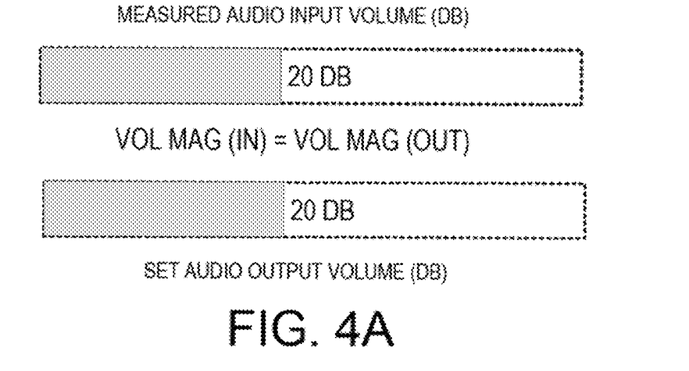
FIGS. 4A-4C illustrate three examples of various methods by which audio input volume levels can be utilized to determine a corresponding audio output volume level, in accordance with several alternate embodiments.
Figure 4B:
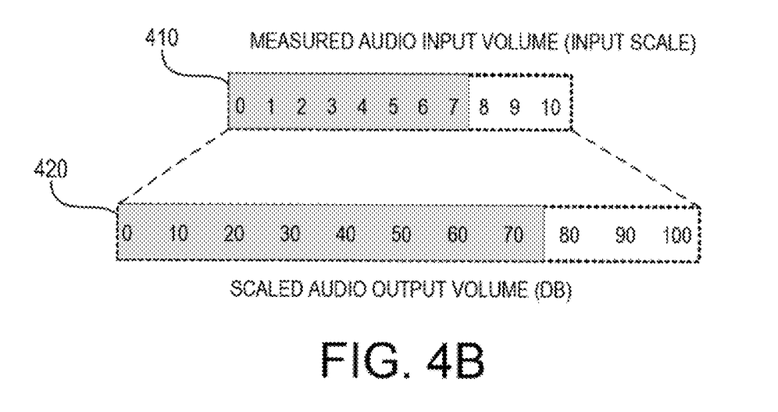
Figure 4C:
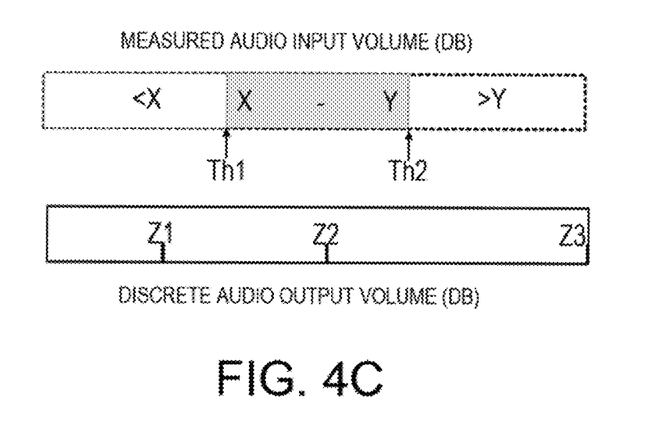

According to one or more embodiments, and as illustrated by FIGS. 4A-4C, the audio output volume level can be determined as (1) a direct match to the audio input volume level or magnitude, as illustrated by FIG. 4A, (2) a relative match based on a scale or ratio of available audio output levels with the available audio input buffer audio level, as indicated by FIG. 4B, or (3) a pre-set discrete audio output level among two or more pre-set discrete levels based on a comparison of audio input volume levels to pre-established threshold values, as illustrated by FIG. 4C.

With FIG. 4A, user device 100 (via execution of audio signal amplitude analyzer 114) determines an absolute value of the received audio input volume level. As shown in the example, the input volume level is determined to be 20 decibels (DB). Using a one to one ratio of input volume level (or volume magnitude) to output volume level, user device 100 then dynamically sets the output volume of the media volume level to be substantially equal in magnitude to that of the determined input volume level. In one or more embodiments, the media output volume control level can range between a lower audio volume setting or an audio mute setting and a maximum audio volume setting. Also, the maximum audio volume setting can, in some embodiments, be less than a maximum received audio input volume level. With these embodiments, the functionality of dynamically setting the media output volume level of the user device to match the input volume level corresponding to the received audio input comprises VARM 100 configuring the user device to: set the media output volume control level to a level that is between the zero level and the maximum level, such that a received audio input volume level that is greater than the maximum audio volume setting is responded to with an audio output at the maximum audio volume setting.

With the embodiment illustrated by FIG. 4B, the audio input buffer 410 has a pre-established range of detectable audio input volume levels, while the audio output buffer 420 has a separate, different range of possible audio volume levels. In the illustrated embodiment, the audio input buffer supports input volume levels 0 through 10, while the audio output volume levels range from 0 to 100. These levels can be absolute volume levels (e.g., measured DB) or another scaled range that is not necessarily based on absolute volume levels. As shown by the example, an input volume level that is a level 7 (e.g., 7 DB) triggers generation of an output with volume level 70 (e.g., 70 DB) due to the 1:10 ratio of input-to-output audio volume level. With this implementation, VARM 110 configures the device to: translate the input volume level to an output volume level based on a relative range of volume levels supported by an audio output device compared to an audio input buffer; dynamically set a media output volume control level of the user device to match the translated input volume level of the received audio input; perform the outputting of the audio output response using the media output volume control level; and in response to completion of the outputting of the audio output response, automatically reset the media output volume control level of the user device to a pre-set volume level for normal media output.

FIG. 4C illustrates yet another embodiment in which the output volume levels are a plurality of (i.e., more than one) preset levels. In one embodiment, these levels can be simply low volume, medium volume, and high or max volume, and can be selected based on a comparison of the detected audio input volume levels to pre-established ranges of values and/or one or more threshold values. In the illustrative embodiment, three ranges of possible audio input volume levels are indicated as input volume less than magnitude X, input volume between X and Y, and input volume greater than magnitude Y. Also, two threshold values are indicated.

A first threshold, Th1, corresponds to a volume level less than volume magnitude X (or inversely a volume greater than magnitude X), and a second threshold, Th2, corresponds to a volume level less than volume magnitude Y (or inversely a volume greater than magnitude Y). VARM 110 can configure the user device 100 to compare the volume level of the received audio input with each of the thresholds to determine which volume range the audio input falls into. FIG. 4C also provides three specific audio output volume settings, including Z1, which is correlated to received audio input with volume magnitude less than X, Z2, which is correlated to received audio input between X and Y, and Z3, which is correlated to received audio input with volume magnitude greater than Y. As presented, Z3 can be a maximum input value, even though the received audio input may be less than a maximum allowable input volume level. Based on the result of the comparison of the volume magnitude for the audio input with the pre-established thresholds, VARM 110 configures the device to select a specific one of the discrete audio output volume setting, from among Z1, Z2, or Z3.

According to one aspect, the use of these ranges of volume levels takes into consideration the fact that the detected audio input will have variations in amplitude that will typically fall within a range of amplitudes. Thus, as an example, an audio input may range between 3 and 5 decibels for a whispered input or 6 to 8 decibels for a normal input, and above 9 decibel for an audio input that is relatively very loud. Assuming these values, the above three ranges are thus defined accordingly, and the thresholds are set based on the edges of these ranges. In one embodiment, the method of determining an input volume level corresponding to the received audio input further includes the user device 100: determining one of (i) a maximum volume of a spoken command within the received audio input and (ii) an average volume of the spoken command; and applying the determined one of the maximum volume and the average volume in selecting the output volume.

According to one alternate embodiment, which is an extension of that presented in FIG. 4C, VARM 110 configures the device to: establish a plurality of distinct, granular audio output volume settings ranging between a low volume setting and a high volume setting. And, the dynamically setting of the media output volume control level of the user device comprises VARM 110 configuring the device to: identify which one of the plurality of discrete audio output volume settings is associated with the range of volume levels in which an amplitude of the received audio input falls; and set the media output volume control level to an identified granular audio output volume setting that is closest in amplitude to the received audio input. The outputting of the audio response then occurs at the identified discrete audio output volume setting.

Figure 5:
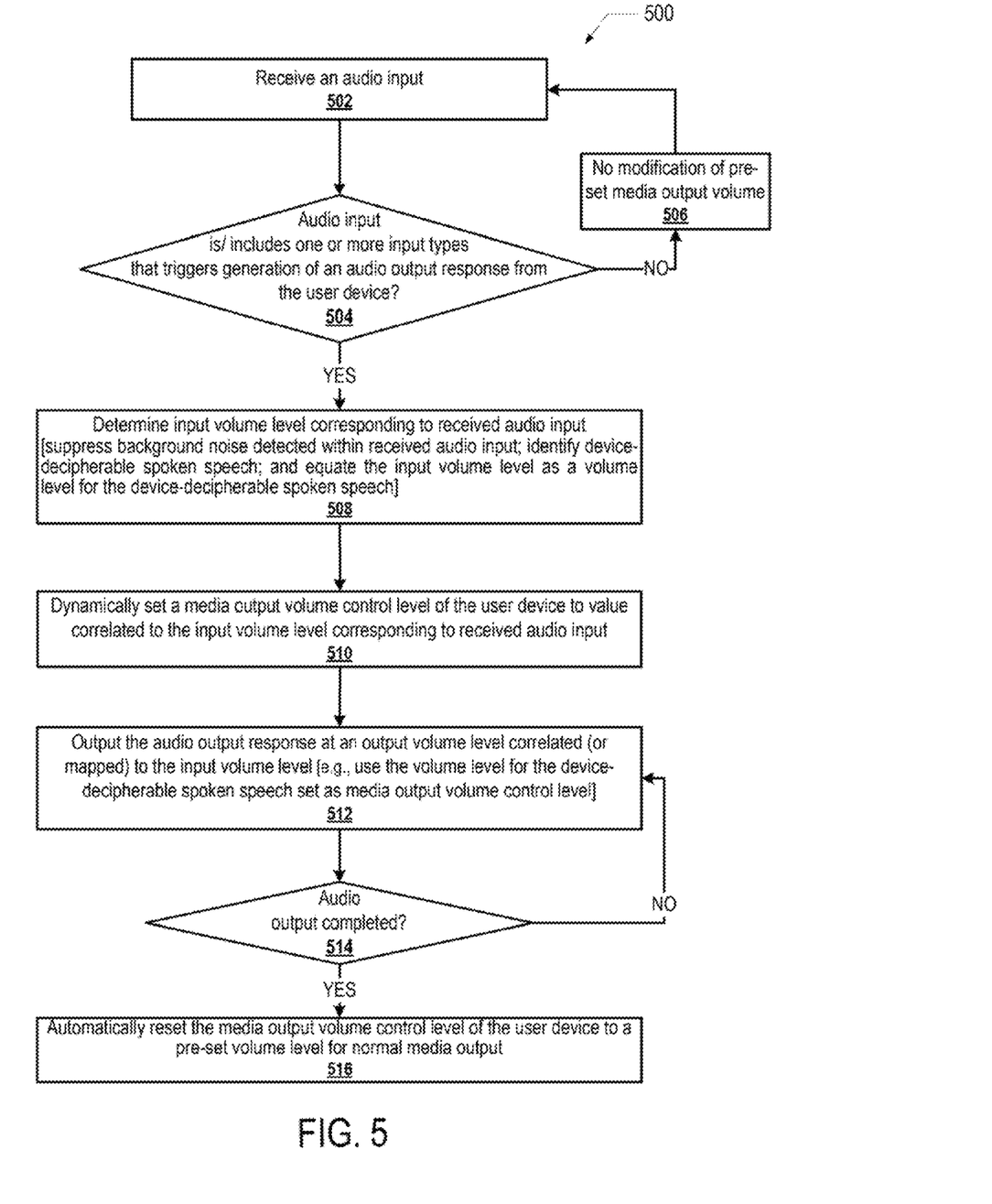
FIG. 5 is a flow chart illustrating a first method for identifying an audio input and modulating a corresponding audio output based on the volume level of the received audio input, according to one or more embodiments.
Figure 6:
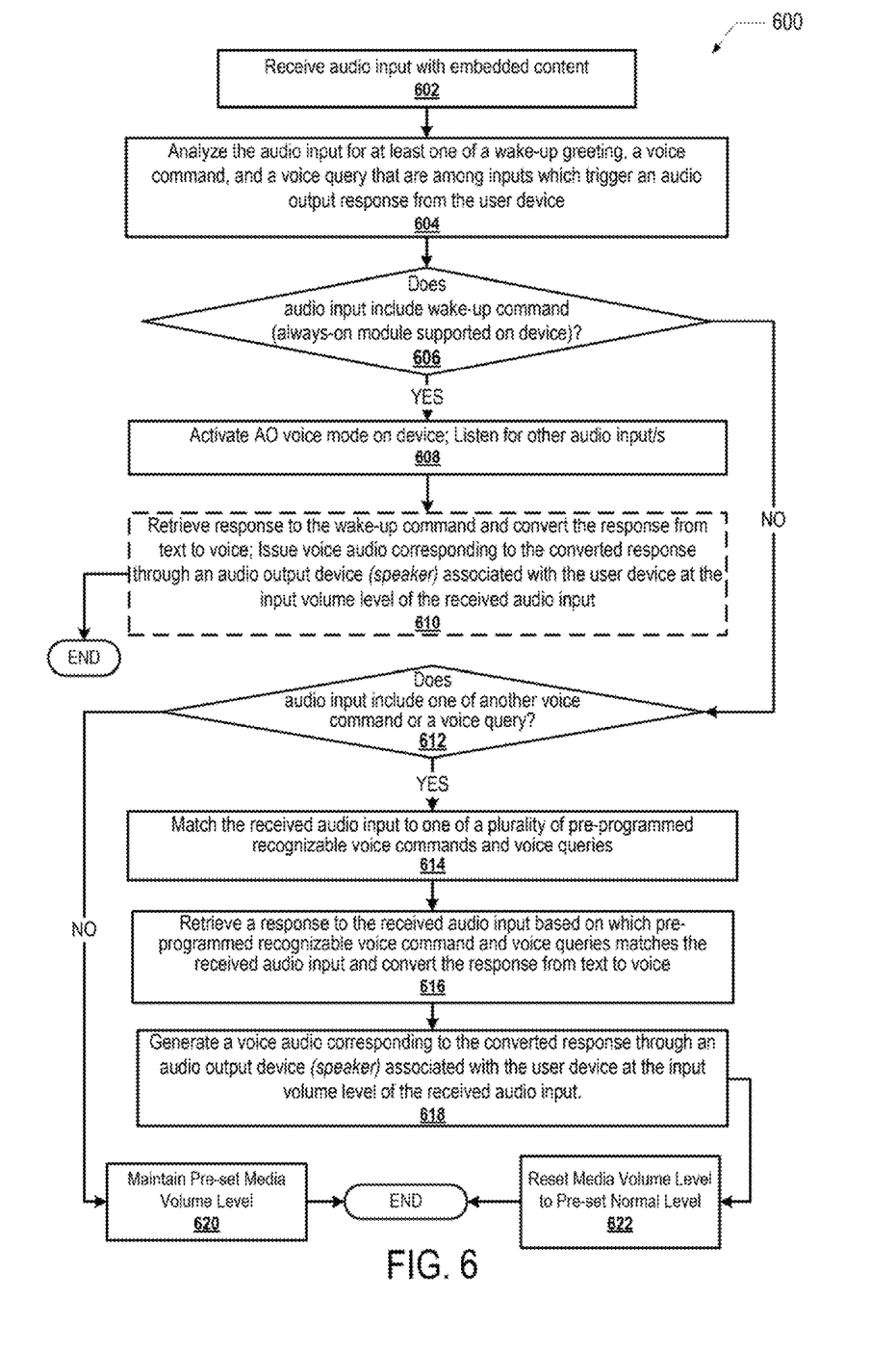
FIG. 6 is a flow chart illustrating a method for discerning and responding to different types of audio inputs with a smart audio output volume control, according to one or more embodiments.
Figure 7:
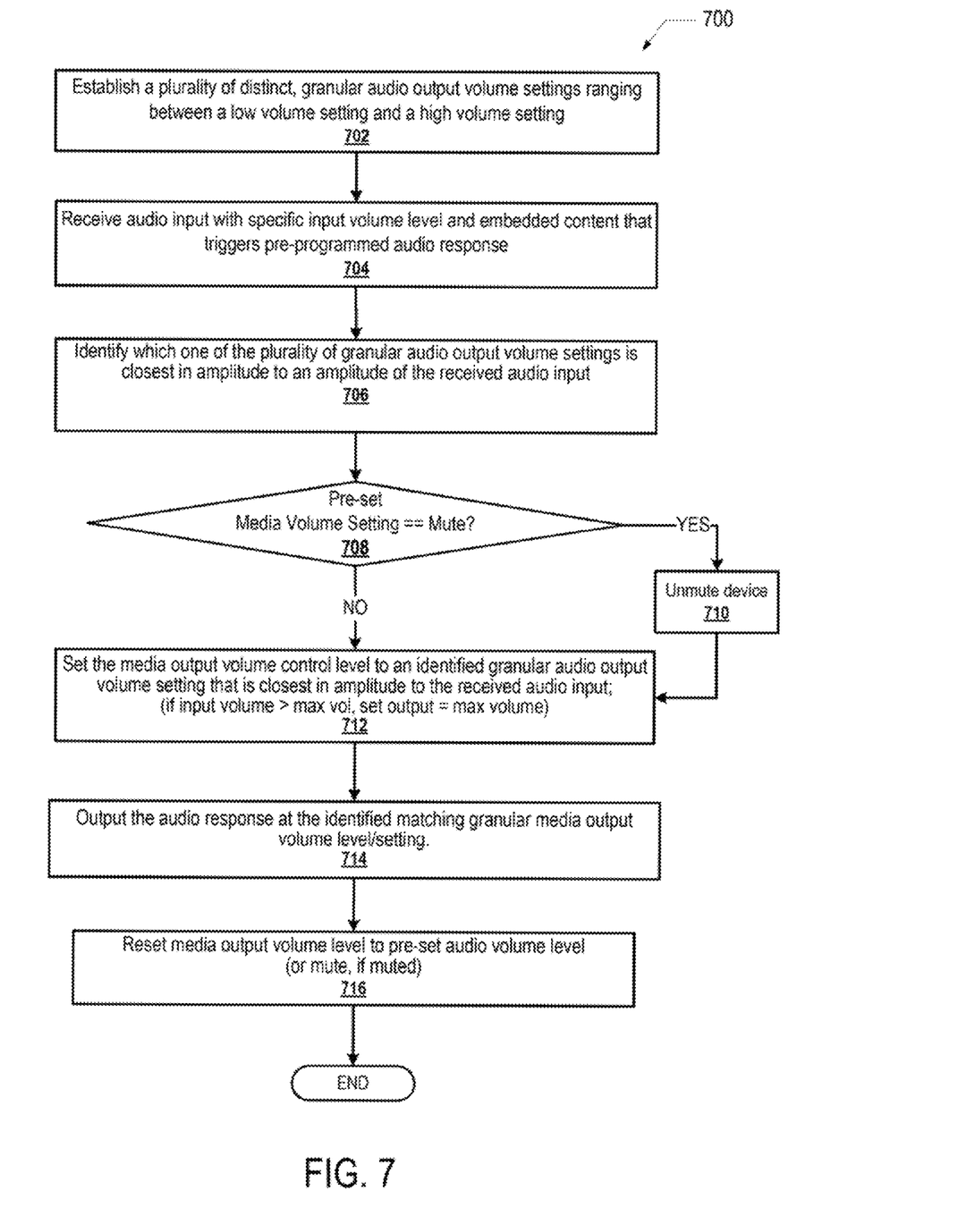
FIG. 7 is a flow chart illustrating a method for discretely assigning volume levels to audio output that correlates to a relative magnitude of the volume level of an audio input that triggers the generation of the audio output, according to one or more embodiments.

With reference now to the flow charts, FIG. 5 is a flow chart illustrating aspects of a first method 500 for identifying an audio input and setting a volume level of a corresponding audio output based on the volume level of the received audio input, according to one or more embodiments. FIG. 6 is a flow chart illustrating aspects of a next method 600 for discerning and responding to different types of audio inputs with a smart audio output volume control, according to one or more embodiments. Finally, FIG. 7 is a flow chart illustrating aspects of a third method 700 for discretely assigning volume levels to audio output that correlates to a relative magnitude of the volume level of an audio input that triggers the generation of the audio output, according to one or more embodiments.

With the method descriptions that follow, certain aspects of the various methods can be implemented by processor 104 (and DSP 106) executing code from one or more of functional component within VARM 110, including SVC utility 112 and/or other software or firmware components of user device 100. Generally, the methods 500, 600, and/or 700 can be described as being performed by one or more of user device 100, processor 104, or by a utility, e.g., VARM 110 or SVC utility 112 executing on processor 104, without limitation. For simplicity, all method processes are described as being completed by user device 100.

FIG. 5 generally presents aspects of a method for controlling a volume level of audio output from a user device. The method 500 begins at block 502 with user device 100 receiving an audio input, which triggers processor execution of code segments of VARM 110 or other executable modules on user device 100. At decision block 504, method 500 includes user device 100 analyzing the audio input and determining whether the audio input is, or includes, one or more inputs which trigger an audio output response from the user device. According to one embodiment, these inputs include at least one of a voice command and a voice query. When the received audio input is not one of the one or more inputs, method 500 includes user device 100 responding to the audio input in a normal manner (i.e., with no modification of the pre-set media output volume) (block 506). However, in response to the audio input including one of the input types, method flows to block 508 with user device determining an input volume level corresponding to the received audio input.

In one embodiment, the method of determining an input volume level corresponding to the received audio input can further include the user device 100: analyzing the audio input to identify which portion of the audio input is device-decipherable spoken speech; identifying background noise that is not device-decipherable spoken speech within the received audio input; and suppressing the background noise.

Following the determination of the input volume level, method 500 includes user device 100 dynamically setting the media output volume control level of the user device to an output volume level that correlates or maps to the input volume level (block 510), and then outputting the audio response at an output volume level correlated to the input volume level (block 512). According to one embodiment, user device 100 performs the determining and the outputting functions only in response to the audio input including one or more of the inputs.

Method 500 then includes user device 100 checking, at decision block 514, whether the readout of the audio output is completed. The media output volume control level is kept the same until the readout is completed (block 512). In response to the readout of the audio output being completed, method 500 includes user device 100 automatically resetting the media output volume control level of the user device to a pre-set volume level for normal media output (block 516).

FIG. 6 generally presents aspects of a method for controlling a volume level of audio output from a user device when one of a plurality of possible voice inputs is received. The method 600 begins at block 602 with user device 100 receiving an audio input, which has embedded content, including one of a plurality of a voice inputs. Then, at block 604, method 600 includes user device 100 analyzing the audio input for at least one of a voice command and a voice query that are among inputs which trigger an audio output response from the user device. In one embodiment, user device 100 is configured with a voice activated search function that triggers the user device 100 to find one or more results of a search query included within the received audio input and to provide the one or more results via an audio output. At decision block 606, method 600 includes user device 100 determining whether the embedded content in the audio input includes a wake-up command, associated with the always-on module 160 of the user device 100. In response to the audio input being a wake-up command received by an always-on module within the user device 100, method 600 includes user device 100: activating the AO voice mode on the device and listening for other audio input/s (block 608). Method 600 optionally includes retrieving a response to the wake-up command, converting the response from text to voice, and issuing or outputting the voice audio corresponding to the converted response through an audio output device, e.g., speaker 126, associated with the user device 100 at the input volume level of the received audio input (block 610). The processes of block 610 are triggered to occur only when activation of the AO voice mode is preset to also generate an audio response.

When the embedded content in the audio input is not a wake-up command, method 600 further includes user device 100 determining, at decision block 612, whether the input audio includes one of a different voice command or a voice query. When the input audio does not include one of a voice command or a voice query, method 600 transitions to block 620 at which user device 100 maintains the preset media volume level, before method 600 ends at end block. In response to the audio input being one of (or including one of) a voice command and a voice query, method 600 includes user device 100: matching the received audio input to one of a plurality of recognizable voice commands and voice queries (block 614); retrieving a response to the received audio input based on which recognizable voice command and voice query matches the received audio input and converting the response from text to voice (block 616). Method 600 then includes user device 100 generating a voice audio corresponding to the converted response through an audio output device, e.g., microphone 121, associated with the user device 100 at the output volume that corresponds or correlates to the input volume level. In one embodiment, described further in reference to FIG. 7, method 600 also includes translating the input volume level to an output volume level based on a relative range of volume levels supported by an audio output device compared to an audio input buffer. Following completion of outputting the audio, method 600 also includes user device 100 resetting the media volume level to the pre-set normal level (block 622).

Referring now to FIG. 7, there is presented additional aspects of a method for controlling a volume level of audio output based on a pre-selected metric for correlating a magnitude of a received audio input with a specific magnitude of the audio output from a user device. The method 700 begins at block 702 with user device 100 establishing a plurality of distinct, granular audio output volume settings ranging between a low volume setting and a high volume setting. At block 704, method 700 includes user device 100 receiving an audio input at a specific input volume level. The audio input includes embedded content that is one of a plurality of voice inputs that triggers an audio response. In order to dynamically set the media output volume control level of the user device, method 700 includes user device 100 identifying which one of the plurality of granular audio output volume settings is closest in amplitude to an amplitude of the received audio input (block 706). Method 700 then includes user device 100 determining at decision block 708 whether the preset media volume setting or the device audio volume setting is set to mute. In response to the media output volume or device output being initially set to mute, the user device 100 unmutes the user device (block 710), and sets the media output volume control level to an identified granular audio output volume setting that is closest in amplitude to the received audio input (block 712).

In one embodiment, the media output volume control level ranges between an audio mute setting and a maximum audio volume setting. Dynamically setting the media output volume level of the user device to match the input volume level corresponding to the received audio input then includes the user device 100 setting the media output volume control level to a level that is between the zero level and the maximum level, such that a received audio input volume level that is greater than the maximum audio volume setting is responded to at the maximum audio volume setting.

Then, at block 714, method 700 includes user device 100 completing the outputting of the audio response at the matching media output volume level or at the identified, matching granular audio output volume setting. Method 700 further includes user device 100 resetting the media output volume to the preset audio volume level (block 716). Also, in one embodiment, when the preset media output volume is set to mute, the user device 100 resets the media output volume to mute, such that no audible audio output is provided that is not generated in response to a received audio input that triggers an audio output response (block 716). Method 700 then ends at end block.

According to one alternate embodiment, method 700 can include user device 100: translating the input volume level to an output volume level based on a relative range of volume levels supported by an audio output device compared to an audio input buffer; dynamically setting a media output volume control level of the user device to match the translated input volume level of the received audio input; and performing the outputting of the audio output response using the media output volume control level.

Also, in one embodiment, in response to the received audio input having an input volume level that is loud enough to discern the context, but is below a threshold minimum volume level at which audio response is discernible, method 700 can include user device 100 translating the audio output into text and providing a text output in lieu of the audio output.

The above described features of the disclosure provides a solution to situations in which the owner or user of the user device 100 may not want the audible output that is being generated by the device to be broadcasted from the electronic device and/or may prefer the audio output only be broadcast at a lower volume level because of the location in which electronic device is being operated. As one example, a user in a movie theatre or at church may voice a question to the phone by whispering to the phone during the movie/church service. In this particular use-setting, the user would prefer to not have the device respond at full media volume setting. Also, the use may have set his/her mobile phone to mute, and have forgotten that the mute setting prevents the receipt of an audio response. Regardless of the device's setting, however, the user will likely not remember to turn the voice-response feature completely off to avoid the inevitable loud response or to turn the mute off to hear the response. These and other conditions are addressed by the described features of the disclosure.

In each of the flow charts presented herein, certain steps of the methods can be combined, performed simultaneously or in a different order, or perhaps omitted, without deviating from the spirit and scope of the described innovation. While the method steps are described and illustrated in a particular sequence, use of a specific sequence of steps is not meant to imply any limitations on the innovation. Changes may be made with regards to the sequence of steps without departing from the spirit or scope of the present innovation. Use of a particular sequence is therefore, not to be taken in a limiting sense, and the scope of the present innovation is defined only by the appended claims.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

Aspects of the present innovation are described below with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

While the innovation has been described with reference to exemplary embodiments, it will be understood by those skilled in the art that various changes may be made and equivalents may be substituted for elements thereof without departing from the scope of the innovation. In addition, many modifications may be made to adapt a particular system, device or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description, but is not intended to be exhaustive or limited to the innovation in the form disclosed. Many modifications and variations will be apparent to those of ordinary skill in the art without departing from the scope and spirit of the innovation. The embodiment was chosen and described in order to best explain the principles of the innovation and the practical application, and to enable others of ordinary skill in the art to understand the innovation for various embodiments with various modifications as are suited to the particular use contemplated.

What is claimed is:

1. A method for controlling a volume level of an audible audio output response from a mobile user device, the method comprising:

receiving, by the mobile user device, an audio input that triggers generation of the audible audio output response from the mobile user device;

determining, by the mobile user device based on the received audio input received by the mobile user device, an input volume level corresponding to the received audio input;

determining, by the mobile user device based on the determined input volume level corresponding to the received audio input, a media output volume control setting from a plurality of distinct granular audio output volume levels correlated to the determined input volume level corresponding to the received audio input;

outputting, by the mobile user device, the audible audio output response at an output volume level correlating to the determined media output volume control setting; and automatically resetting the media output volume control level of the mobile user device.

2. The method of claim 1, wherein determining the input volume level corresponding to the received audio input and determining the media output volume control setting further comprise:

determining one of a maximum volume level of a spoken command within the received audio input and an average volume level of the spoken command within the received audio input; and determining the media output volume control setting based on the determined one of the maximum volume level of the spoken command within the received audio input and the average volume level of the spoken command within the received audio input.

3. The method of claim 1, wherein determining the input volume level corresponding to the received audio input further comprises:

analyzing the audio input to identify which portion of the audio input is device-decipherable spoken speech;

identifying background noise that is not device-decipherable spoken speech within the received audio input; and suppressing the background noise.

4. The method of claim 1, wherein determining the media output volume control setting is based on a ratio of the distinct granular audio output volume levels of the user device with available audio input buffer volume levels of the user device.

5. The method of claim 1, further comprising:

establishing, by the mobile user device, the plurality of distinct granular audio output volume level settings ranging between a low volume level setting and a high volume level setting; and wherein the determining the media output volume control setting of the mobile user device from the plurality of distinct granular audio output volume level settings comprises identifying which one of the plurality of distinct granular audio output volume level settings correlates to an audible output that is closest in volume level to the received audio input volume levels.

6. The method of claim 1, wherein in response to the media output volume control setting being initially set to a mute audio volume level setting, the automatically resetting the media output volume control level of the mobile user device resets to the mute audio volume level setting.

7. The method of claim 1, wherein automatically resetting the media output control volume level of the mobile use device reverts to a volume level at which the mobile user device was set prior to the outputting the audio output response at the output volume level.

8. The method of claim 1, wherein automatically resetting the media output control volume level of the mobile user device reverts to a pre-set volume level for normal media output.

9. The method of claim 1, wherein the determined input volume level corresponding to the received audio input is a translated input volume level.

10. The method of claim 9, wherein the translated input volume level is based on a relative range of volume levels supported by an audio output device compared to an audio input buffer.

11. An electronic device comprising:
at least one microphone that captures audio input;
at least one speaker;
a digital signal processor (DSP) that processes received audio input signals and generates audio output signals;
a processor that is communicatively coupled to each of the at least one microphone, the at least one speaker, and the DSP; and
a smart volume control (SVC) utility that executes on the processor and which configures the electronic device to:
receive an audio input that triggers generation of an audible audio output response from the electronic device;
determine an input volume level corresponding to the received audio input;
determine a media output volume control setting, the media output control volume setting from a plurality of distinct audio output volume levels and determined based on the determined input volume level;
output the audible audio output response at an output volume level correlating to the determined media output volume control setting; and
automatically reset the media output volume control level of the electronic device.

12. The electronic device of claim 11, wherein to determine an input volume level corresponding to the received audio input and to determine the media output volume control setting, the SVC utility further configures the device to:
determine one of a maximum volume level of a spoken command within the received audio input and an average volume level of the spoken command within the received audio input; and
determine the media output volume control setting based on the determined one of the maximum volume level of the spoken command within the received audio input and the average volume level of the spoken command within the received audio input.

13. The electronic device of claim 11, wherein to determine the input volume level corresponding to the received audio input, the SVC utility further configures the device to:
analyze the audio input to identify which portion of the audio input is device-decipherable spoken speech;
identify background noise that is not device-decipherable spoken speech within the received audio input; and
suppress the background noise.

14. The electronic device of claim 11, wherein the SVC utility further configures the device to determine the media output volume control setting based on a ratio of the distinct granular available audio output volume levels with available audio input buffer volume levels.

15. The electronic device of claim 11, wherein the SVC utility further configures the device to:
establish the plurality of distinct granular audio output volume level settings ranging between a low audio output volume level setting and a high audio output volume level setting; and
wherein the determination of the media output volume control setting of the device from the plurality of distinct granular audio output volume control settings comprises the SVC utility configuring the device to identify which one of the plurality of distinct granular audio output volume level settings correlates to audible audio output that is closest in volume level to the received audio input volume level.

16. The electronic device of claim 11, wherein in response to the media output volume control setting being initially set to a mute audio volume level setting, the SVC utility configures the device to automatically reset the media output volume control level to the mute audio volume level setting.

17. The electronic device of claim 11, wherein the automatic reset of the media output control volume level of the device reverts the media output control volume level to a volume level at which the device was set prior to the output of the audio output response at the output volume level.

18. The electronic device of claim 11, wherein the automatic reset of the media output control volume level of the device reverts the media output control volume level to a pre-set volume level for normal media output.

19. The electronic device of claim 11, wherein the determined input volume level is a translated input volume level.

20. The electronic device of claim 19, wherein the translated input volume level is based on a relative range of volume levels supported by an audio output device compared to an audio input buffer.

* * * * *

UNITED STATES PATENT AND TRADEMARK OFFICE
CERTIFICATE OF CORRECTION

PATENT NO.         : 9,787,273 B2
APPLICATION NO.    : 13/948189
DATED              : October 10, 2017
INVENTOR(S)        : Boby Iyer Page 1 of 1

It is certified that error appears in the above-identified patent and that said Letters Patent is hereby corrected as shown below:

In the Claims

Column 17, Line 2, after "input volume" delete "levels." insert --level.--

Signed and Sealed this
Seventh Day of November, 2017

Joseph Matal
*Performing the Functions and Duties of the
Under Secretary of Commerce for Intellectual Property and
Director of the United States Patent and Trademark Office*